United States Patent
Brandt et al.

(10) Patent No.: US 7,076,089 B2
(45) Date of Patent: Jul. 11, 2006

(54) FINGERPRINT SENSOR HAVING ENHANCED ESD PROTECTION AND ASSOCIATED METHODS

(75) Inventors: Robert Scott Brandt, Satellite Beach, FL (US); David Carl Gebauer, Melbourne, FL (US); Dale Raymond Setlak, Melbourne, FL (US); Peter Eric Sherlock, Satellite Beach, FL (US); Matthew M. Salatino, Satellite Beach, FL (US)

(73) Assignee: Authentec, Inc., Melbourne, FL (US)

( * ) Notice: Subject to any disclaimer, the term of this patent is extended or adjusted under 35 U.S.C. 154(b) by 629 days.

(21) Appl. No.: 10/150,518

(22) Filed: May 17, 2002

(65) Prior Publication Data

US 2003/0215116 A1    Nov. 20, 2003

(51) Int. Cl.
*G06K 9/00* (2006.01)

(52) U.S. Cl. .................. 382/124; 382/312; 438/55; 438/112

(58) Field of Classification Search ............ 382/116, 382/124, 125, 312–315; 356/71; 257/77, 257/355, 360; 174/52.4; 361/56, 220, 181; 379/106.04; 438/15, 51, 55, 64, 60, 112, 438/119, 124, 126, 127, 457; 324/348, 457; 399/3; 348/294, 311, 306; 264/272.17
See application file for complete search history.

(56) References Cited

U.S. PATENT DOCUMENTS

| | | | |
|---|---|---|---|
| 4,887,166 A | 12/1989 | Kakinuma et al. | 358/471 |
| 4,982,079 A | 1/1991 | Yagyu | 250/208 |
| 5,371,351 A | 12/1994 | Van Berkel | 250/208 |
| 5,778,089 A | 7/1998 | Borza | 382/124 |
| 5,862,248 A * | 1/1999 | Salatino et al. | 382/124 |
| 5,869,869 A | 2/1999 | Hively | 257/335 |
| 5,940,526 A | 8/1999 | Setlak et al. | 382/124 |
| 5,963,679 A | 10/1999 | Setlak | 382/313 |
| 6,018,183 A | 1/2000 | Hsu | 257/355 |
| 6,028,338 A | 2/2000 | Saito et al. | 257/360 |
| 6,091,082 A | 7/2000 | Thomas et al. | 257/77 |
| 6,091,132 A | 7/2000 | Bryant | 257/362 |
| 6,121,661 A | 9/2000 | Assaderaghi et al. | 257/335 |
| 6,140,581 A | 10/2000 | Cowan et al. | 174/52.4 |

(Continued)

FOREIGN PATENT DOCUMENTS

EP    1 017 009    7/2000

(Continued)

*Primary Examiner*—Sheela Chawan
(74) *Attorney, Agent, or Firm*—Allen, Dyer, Doppelt, Milbrath & Gilchrist, P.A.

(57) ABSTRACT

A fingerprint sensor may include a plurality of electrostatic discharge (ESD) electrodes carried by a dielectric layer of a fingerprint sensing portion. The fingerprint sensing portion is for sensing a fingerprint of a user. The fingerprint sensing portion may include the dielectric layer, and, in some embodiments, may also include an array of sensing electrodes also carried by the dielectric layer. Accordingly, each ESD electrode may be interposed between adjacent sensing electrodes. The ESD electrodes attract ESD events and dissipate the energy therein to avoid damaging adjacent sensing electrodes and/or portions of the dielectric layer. The fingerprint sensor may also include an electrically conductive layer connected to the ESD electrodes, which may provide a convenient ground plane, for example, for removing ESD energy from the fingerprint sensor. The electrically conductive layer may extend beneath the sensing electrodes.

48 Claims, 3 Drawing Sheets

U.S. PATENT DOCUMENTS

| | | | |
|---|---|---|---|
| 6,246,566 B1 | 6/2001 | Glenn ........................ | 361/220 |
| 6,256,022 B1 * | 7/2001 | Manaresi et al. ........... | 345/174 |
| 6,317,508 B1 * | 11/2001 | Kramer et al. ............... | 382/124 |
| 6,479,869 B1 * | 11/2002 | Hiraga ........................ | 257/350 |
| 6,628,812 B1 * | 9/2003 | Setlak et al. ................ | 382/124 |

FOREIGN PATENT DOCUMENTS

| | | |
|---|---|---|
| WO | 98/52147 | 11/1998 |
| WO | 01/06448 | 1/2001 |
| WO | 02/44998 | 6/2002 |

* cited by examiner

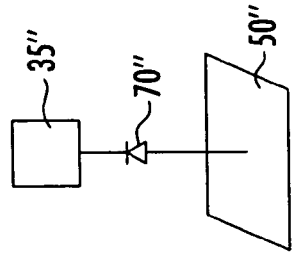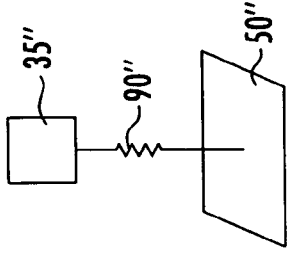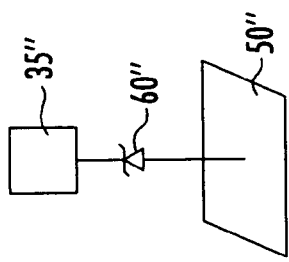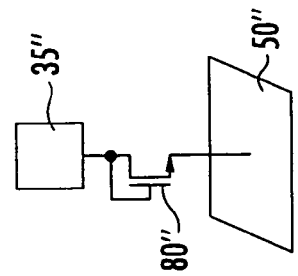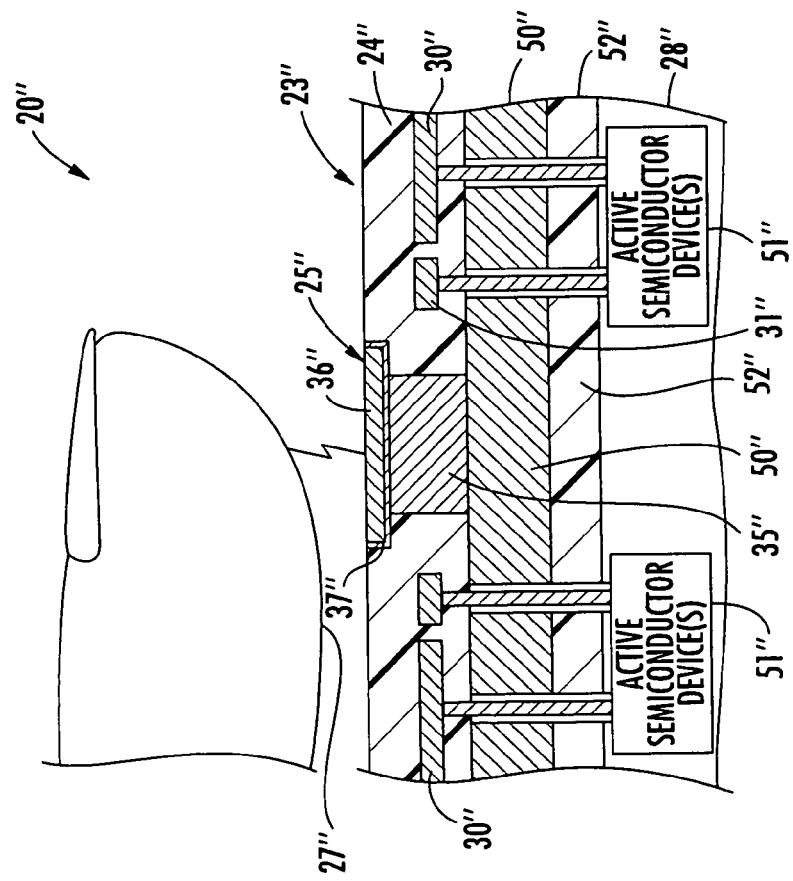

FINGERPRINT SENSOR HAVING ENHANCED ESD PROTECTION AND ASSOCIATED METHODS

FIELD OF THE INVENTION

The present invention relates to fingerprint sensors, and more particularly, to fingerprint sensor and related methods providing ESD protection.

BACKGROUND OF THE INVENTION

Fingerprint sensing and matching is a reliable and widely used technique for personal identification or verification. In particular, a common approach to fingerprint identification involves scanning a sample fingerprint or an image thereof and storing the image and/or unique characteristics of the fingerprint image. The characteristics of a sample fingerprint may be compared to information for reference fingerprints already in a database to determine proper identification of a person, such as for verification purposes.

A significant advance in the area of fingerprint sensors is described, for example, in U.S. Pat. Nos. 5,862,248; 5,940,526; and 5,963,679 all assigned to AuthenTec Inc., the assignee of the present invention. Each of the patents discloses an integrated circuit fingerprint sensor including a substrate and active devices formed therein. A patterned metallization layer embedded in a dielectric layer over the substrate provides electric field sensing electrodes. A shield electrode surrounds each sensing electrode, and a sharp and accurate image of the fingerprint is generated by the sensor. An encapsulating package surrounds the integrated circuit, but has an opening therein to expose the fingerprint sensing portion.

The Setlak et al. '526 patent, for example, also discloses an electrode ring carried by the encapsulating package adjacent the finger receiving opening. This electrode ring contacts the finger of the user to thereby collect and dissipate any electrostatic charge carried by the person. Electrostatic discharge (ESD), is the transfer of an electrostatic charge between bodies at different electrostatic potentials, such as caused by direct contact or induced by an electrostatic field. Electronic devices may be especially prone to damage from ESD events.

Another related approach to providing ESD protection in an integrated circuit fingerprint sensor is disclosed in published U.S. patent application No. 2001/0012384 A1 to Kalnitsky et al. This application discloses a planar fingerprint pattern detecting array including a large number of individual sensing cells in a dielectric layer that are arranged in a row/column configuration. To provide protection against electrostatic discharge, the sensor includes metal paths within the dielectric layer that spatially surround each of the sensing cells. The metal paths are directly connected to ground.

Although the ring electrode disclosed in the Setlak et al. '526 patent surrounding the package thereof significantly reduces the likelihood of damage from an ESD event, some ESD events may still cause a discharge to the electric field sensing electrodes, for example. Such an ESD event may damage the sensing electrodes and/or the processing circuitry connected thereto. While the metal paths which surround the sensing cells disclosed in the Kalnitsky et al. application may provide some additional protection against a discharge to the electric field sensing electrodes, this approach may limit the surface area available for the sensing cells and not be effective for some ESD events.

SUMMARY OF THE INVENTION

In view of the foregoing background, it is therefore an object of the present invention to provide a fingerprint sensor and associated method so that the sensor enjoys enhanced ESD protection to thereby provide greater reliability.

This and other objects, features and advantages in accordance with the present invention are provided by a fingerprint sensor including a plurality of electrostatic discharge (ESD) electrodes carried by a dielectric layer of a fingerprint sensing portion. More particularly, the fingerprint sensing portion is for sensing a fingerprint of a user positioned adjacent thereto. The fingerprint sensing portion may include the dielectric layer, and, in some embodiments, may also include an array of sensing electrodes also carried by the dielectric layer. Accordingly, each ESD electrode may be interposed between adjacent sensing electrodes. The ESD electrodes attract ESD events and dissipate the energy therein to avoid damaging adjacent sensing electrodes and/or portions of the dielectric layer.

The fingerprint sensor may also include an electrically conductive layer connected to the ESD electrodes, which may provide a convenient ground plane, for example, for removing ESD energy from the fingerprint sensor. The electrically conductive layer may extend beneath the sensing electrodes.

The ESD electrodes may be exposed at an upper surface of the dielectric layer. The sensing electrodes may also be embedded in the dielectric layer. In addition, the fingerprint sensing portion may further comprise an electrically conductive guard ring surrounding each sensing electrode.

Outermost ones of the sensing electrodes may be considered as defining an available sensing area. To provide a balance between ESD protection and desired fingerprint image quality, the ESD electrodes may occupy less than about ten percent of the available sensing area, and, more preferably, less than two percent of the available sensing area.

Each sensing electrode may be of a same size. In these embodiments, the array of sensing electrodes may also be arranged in a regular grid pattern with predetermined locations within the grid pattern being unoccupied by sensing electrodes, and, instead, occupied by respective ESD electrodes.

Also, each of the ESD electrodes may have a smaller size than the size of the sensing electrodes so as to define an enlarged spacing between each ESD electrode and adjacent sensing electrodes. This also serves to enhance protection of the adjacent sensing electrodes.

In other embodiments, each sensing electrode may have a generally rectangular shape. Moreover, the sensing electrodes adjacent each ESD electrode may have cut-off corner portions to provide spacing for each ESD electrode. Also, the ESD electrodes may have a substantially similar shape as the sensing electrodes in some embodiments.

The fingerprint sensing portion may further include a semiconductor substrate adjacent the dielectric layer and having active semiconductor devices formed therein. In other words, the fingerprint sensing portion may be provided by an integrated circuit including active processing circuitry formed therein. Of course, in other embodiments, the active circuitry may be provided by circuitry separate and apart from the fingerprint sensing portion.

Each ESD electrode may include a vertically conducting portion extending through the dielectric layer, and an enlarged top portion connected thereto. The enlarged top portion may comprise gold, for example. The fingerprint sensor may also include a package surrounding the fingerprint sensing portion. The package preferably has an opening therein to expose an upper surface of the fingerprint sensing portion.

Additionally, at least one respective isolation element may be used for connecting each of the ESD electrodes to the electrically conductive layer. By way of example, the isolation elements may include one or more of diodes, Zener diodes, resistors, and/or transistors.

A method aspect of the invention is for making a fingerprint sensor. In particular, the method may include forming an electrically conductive layer and forming a fingerprint sensing portion adjacent the electrically conductive layer for sensing a fingerprint of a user positioned adjacent thereto. The fingerprint sensing portion may include a dielectric layer and an array of sensing electrodes carried thereby. Further, the electrically conductive layer may extend beneath the sensing electrodes. In addition, the method may also include forming a plurality of electrostatic discharge (ESD) electrodes interposed between adjacent sensing electrodes and carried by the dielectric layer for ESD protection of the fingerprint sensing portion. Also, each ESD electrode may be connected to the electrically conductive layer.

BRIEF DESCRIPTION OF THE DRAWINGS

FIG. 5 is a greatly enlarged schematic cross-sectional view similar to that of FIG. 3 illustrating an alternate embodiment of the invention.

FIGS. 6–9 are schematic block diagrams illustrating various isolation devices for connecting the vertically conducting portion and the electrically conductive layer of FIG. 5.

DETAILED DESCRIPTION OF THE PREFERRED EMBODIMENTS

Figure 1:
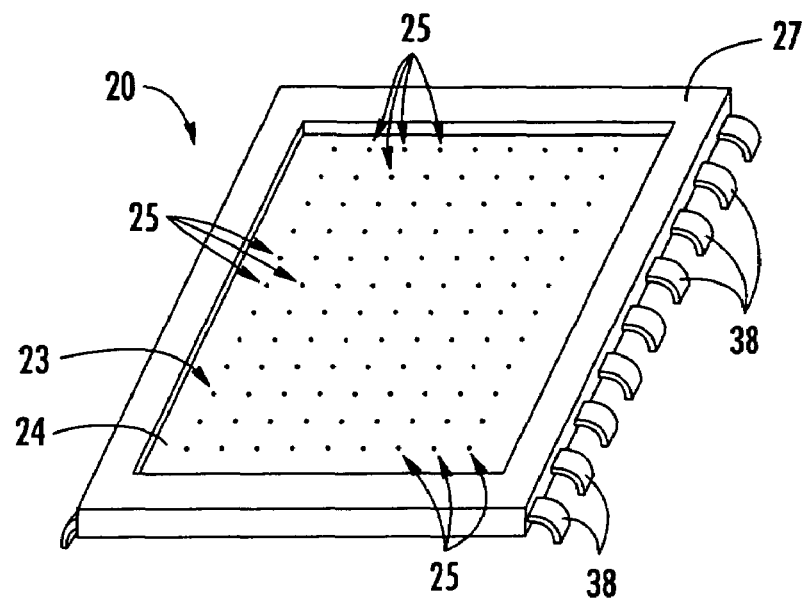
FIG. 1 is a schematic perspective view of an embodiment of a fingerprint sensor in accordance with the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. The sizes of regions and layers may be exaggerated in the drawings for greater clarity. Like numbers refer to like elements throughout, and prime and multiple prime notation is used to indicate similar elements in alternate illustrated embodiments.

Figure 2:
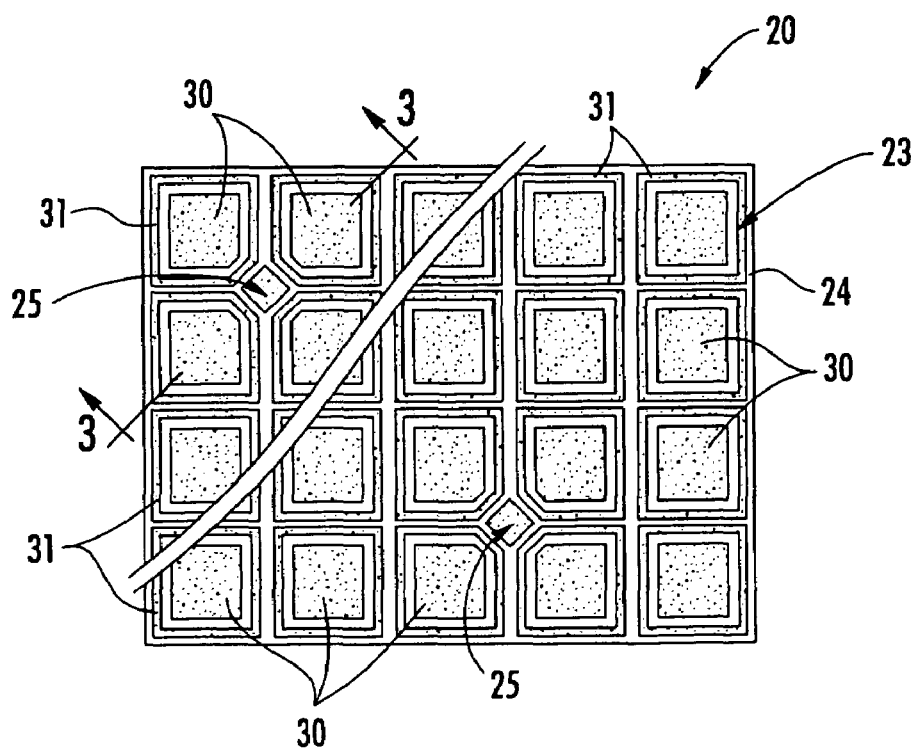
FIG. 2 is a greatly enlarged schematic top plan view of the surface of the fingerprint sensing portion of the sensor as shown in FIG. 1.
Figure 3:
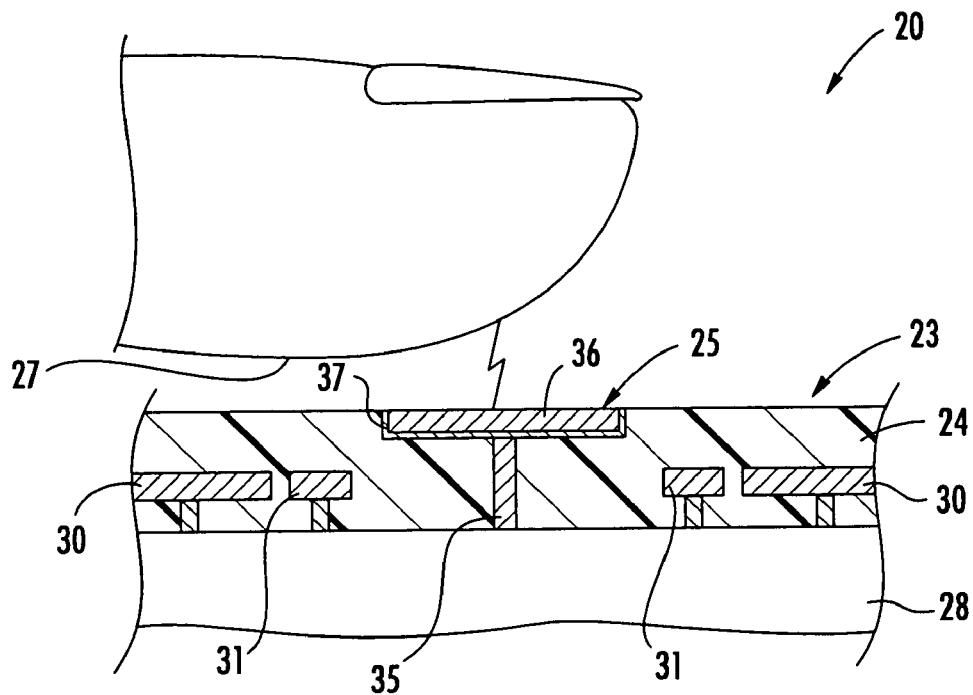
FIG. 3 is a greatly enlarged schematic cross-sectional view taken along line 3—3 of FIG. 2.

Referring initially to FIGS. 1–3 a first embodiment of a fingerprint sensor 20 in accordance with the present invention is now described. The fingerprint sensor 20 enjoys enhanced ESD protection to thereby provide greater reliability. The fingerprint sensor 20 illustratively includes a plurality of ESD electrodes 25 carried by a dielectric layer 24 of a fingerprint sensing portion 23. The fingerprint sensing portion 23 is for sensing a fingerprint 27 of a user positioned adjacent the sensing portion.

The fingerprint sensing portion 23 illustratively includes the dielectric layer 24, and, an array of sensing electrodes 30 carried by the dielectric layer. The sensing electrodes 30 may be for sensing an electric field, for example, as used hereafter for purposes of illustration. Each ESD electrode 25 is interposed between adjacent electric field sensing electrodes 30. As will be readily appreciated by those skilled in the art, the ESD electrodes 25 attract ESD events and dissipate the energy therein, such as through a ground connection. This reduces a likelihood of damaging adjacent electric field sensing electrodes 30 and/or portions of the dielectric layer 24 when an ESD event occurs.

For those embodiments including a semiconductor substrate 28 with active semiconductor devices 51" formed therein (FIG. 5), the ESD electrodes 25 also protect against damage to the active circuitry. In other words, in these embodiments, the fingerprint sensing portion 23 may be provided by an integrated circuit including active processing circuitry formed therein. As will also be appreciated by those skilled in the art, in other embodiments, the active image processing circuitry may be provided on another substrate or chip separate from the fingerprint sensing portion 23.

As understood with specific reference to FIG. 1, the fingerprint sensor 20 may also comprise a package 27 surrounding the fingerprint sensing portion 23. The package 27 has an opening therein to expose an upper surface of the fingerprint sensing portion 23. The package 27 also illustratively includes a plurality of conductive pins 38 extending outwardly therefrom to connect to associated circuitry as will be appreciated by those skilled in the art.

As shown perhaps best in the cross-sectional view of FIG. 3, the ESD electrodes 25 may be exposed at an upper surface of the dielectric layer 24. As also shown in this figure, the electric field sensing electrodes 30 may be embedded in the dielectric layer 24. Of course, in yet other embodiments, the ESD electrodes 25 may be embedded in the dielectric layer 24 and/or the electric field sensing electrodes 30 may be exposed at the upper surface. The ESD electrodes 25 may also extend slightly above the adjacent surface of the dielectric layer 24 in other embodiments, and as will also be appreciated by those skilled in the art.

The fingerprint sensing portion 23 may also optionally include an electrically conductive guard ring 31 surrounding each electric field sensing electrode 30. This optional guard ring 31 is provided in slightly spaced relation from the adjacent portions of the electric field sensing electrode 30. In addition, each guard ring 31 is slightly spaced apart from neighboring guard rings.

The electric field sensing electrode 30 and/or associated optional guard ring 31 may be considered as providing a pixel element for imaging of the fingerprint 27. Additional details on the operation of the electric field sensing electrodes 30, associated guard rings 31, and related processing circuitry may be found in U.S. Pat. No. 5,940,526 to Setlak et al., for example, the entire contents of which are incorporated herein by reference. Those of skill in the art will recognize that other types of fingerprint sensing portions 23, such as based on other sensing technology, may also advantageously include the ESD electrodes 25 in accordance with the present invention. In slightly different terms, the ESD electrodes 25 may be considered as ESD lightning rods which are positioned between adjacent ones of the image sensing pixel elements to protect the other components from ESD damage.

Outermost ones of the electric field sensing electrodes 30 may be considered as defining an available sensing area. For example, in a related commercial fingerprint sensor offered by the assignee of the present invention under the designation FingerLoc™ AF-S2™, the area is about 13 mm (0.5 in) square. This is made up of 16,384 individual elements arranged in a 128×128 pattern. In another commercially available sensor embodiment offered under the designation EntrePad™, the available sensing area is 11.43 mm (0.45 in) square, which is composed of 9,216 individual elements arranged in a 96×96 square pattern. Of course, other areas and numbers of pixel elements are contemplated by the invention as will be appreciated by those skilled in the art.

To provide a balance between ESD protection and desired fingerprint image quality, the ESD electrodes may occupy less than about ten percent of the available sensing area, and, more preferably, less than two percent of the available sensing area. In an embodiment described in greater detail below, one of every 64 pixels is replaced with an ESD electrode so that the available sensing area used for ESD is 1/64 or 1.56 percent.

In the illustrated embodiment of FIGS. 1–3, each electric field sensing electrode 30 may have a generally rectangular or square shape. The array of electric field sensing electrodes 30 may be such that centers of the electric field sensing electrodes are located along a regular grid pattern. Moreover, the electric field sensing electrodes 30 adjacent each ESD electrode 25 may have cut-off corner portions to thereby provide spacing for each ESD electrode 25. Further, in the illustrated embodiment, the ESD electrodes 25 are slightly smaller squares rotated ninety degrees with respect to the electric field sensing electrodes 30. Of course, those of skill in the art will appreciate other equivalent arrangements for providing an array of ESD electrodes 25 within an array of electric field sensing electrodes 30 or other types of image sensing pixels.

As shown perhaps best in the cross-sectional view of FIG. 3, each ESD electrode 25 may be provided by a vertically conducting portion 35 extending through the dielectric layer 24, and an enlarged top portion 36 connected thereto. The enlarged top portion 36 may comprise gold, for example, or other material that provides good electrical conductivity, yet which is resistant to corrosion or degradation when exposed. An optional barrier layer 37, such as formed of titanium nitride, for example, may be provided to line the opening filled by the top portion 36 of the ESD electrode 25.

Figure 4:
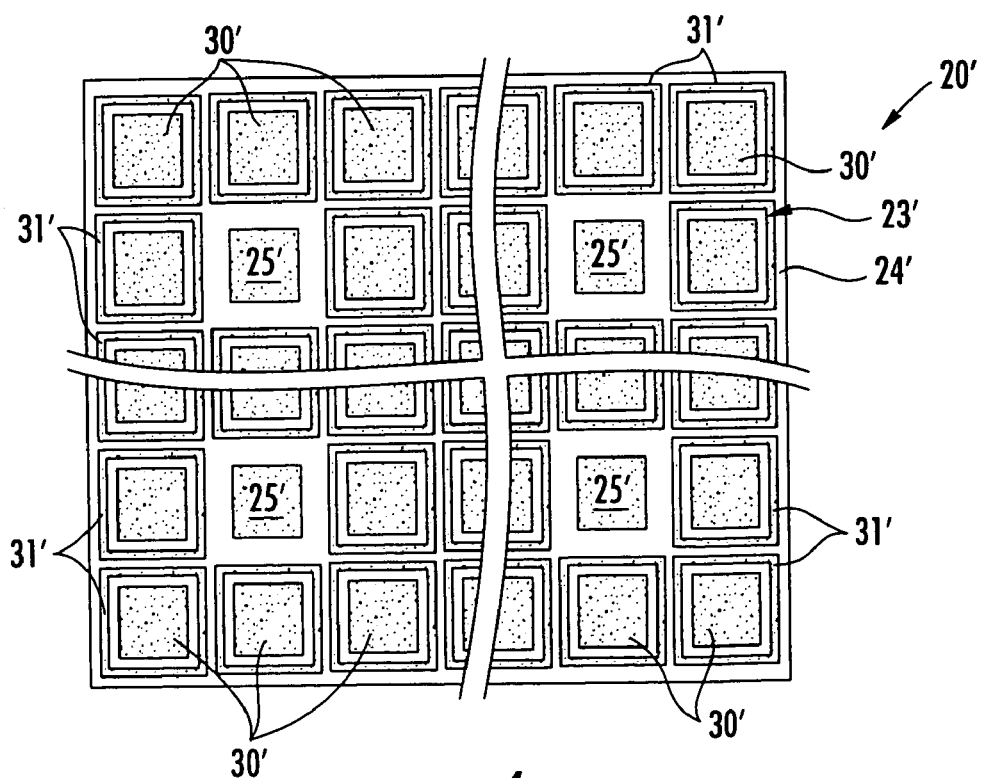
FIG. 4 is a greatly enlarged schematic top plan view of the surface of a fingerprint sensing portion of another embodiment of a fingerprint sensor in accordance with the present invention.

Referring now additionally to FIG. 4, another embodiment of a fingerprint sensor 20' and fingerprint sensing portion 23' is now described. This embodiment includes a different arrangement of electric field sensing electrodes 30' and ESD electrodes 25'. More particularly, each of the array of electric field sensing electrodes 30' is generally of a same size, such as rectangular, and more specifically square, as shown. The array of electric field sensing electrodes 30' is also arranged in a regular grid pattern with predetermined locations within the grid pattern being unoccupied by electric field sensing electrodes and instead occupied by respective ESD electrodes 25'.

For example, an ESD electrode may be provided at every eighth position in both the X and Y directions, although other configurations are possible. Optional spaced apart guard rings 31' are also shown in the illustrated embodiment. Of course, in other embodiments, a regular grid pattern need not be used.

Each of the ESD electrodes 25' may have a smaller size than the size of the electric field sensing electrodes 30' or combination of the electric field sensing electrodes and guard rings 31' so as to define an enlarged spacing between each ESD electrode 25' and adjacent electric field sensing electrodes. This increased spacing may prevent arcing between the ESD electrode 25' and the adjacent electric field sensing electrodes 30' or guard rings 31' as will be appreciated by those skilled in the art.

Turning more particularly to FIG. 5, yet another embodiment of the fingerprint sensor 20" is now described. In the illustrated embodiment, the fingerprint sensor 20" includes an electrically conductive layer 50" (e.g., a metal layer) adjacent the dielectric layer 24" and extending beneath the electric field sensing electrodes 30". More specifically, a dielectric layer 52" is preferably formed on the substrate 28", and the electrically conductive layer 50" is formed between the dielectric layer 52" and the dielectric layer 24". Of course, in other embodiments additional conductive and/or dielectric layers may be provided between the conductive layer 50" and the substrate 28". Also, additional conductive and/or dielectric layers may be provided between the conductive layer 50" and the sensing electrodes 30", for example.

The electrically conductive layer 50" is preferably connected to one or more of the pins 38 (FIG. 1) (e.g., power and/or ground pins) and may advantageously provide a convenient ground plane for conducting ESD energy safely away from the sensing electrodes 30" and active semiconductor devices 51" and out of the package 27 via the pin(s). Optional protective diodes or bipolar semiconductor devices (not shown) may also be used to provide additional ESD protection, and such devices may be connected between the electrically conductive layer 50" and the power and/or ground pins 38 that conduct the ESD energy away from the fingerprint sensor 20", as will be appreciated by those of skill in the art.

Additionally, reference voltages and signal grounds for the electric field sensing electrodes 30" may be provided by independent distribution circuits (e.g., in the substrate 28") (not shown) that are separated from the electrically conductive layer 50" to further isolate these components from ESD energy. Of course, the electrically conductive layer 50" may also serve as a signal ground in some embodiments, as will be appreciated by those of skill in the art.

It should be noted that the vertically conducting portion 35" in FIG. 5 is illustratively relatively thick to provide greater conduction. Additionally, the vertically conducting portion 35" may also include multiple layers of metal to further promote conduction, as will be appreciated by those of skill in the art. Of course, numerous types and combinations of conductive materials and dimensions thereof may be used to provide desired conductivity in different applications, as will also be appreciated by those of skill in the art. The remaining elements illustrated in FIGS. 4 and 5 not specifically referenced herein are similar to those previously described above and therefore will not be discussed further herein.

In other embodiments, at least one respective isolation element may be used for connecting each of the ESD electrodes 25" to the electrically conductive layer 50". That is, the isolation elements isolate each pair of ESD electrodes 25" and respective vertically conducting portion 35" from one another and from the electrically conductive layer 50". This may further reduce the image quality degradation during non-ESD imaging which may otherwise occur from the use of the ESD electrodes 25", as will be understood by those skilled in the art.

Referring more particularly to FIGS. 6–9, various examples of isolation elements are schematically shown which include Zener diodes 60" (FIG. 6), diodes 70" (e.g., clamping diodes) (FIG. 7), transistors 80" (FIG. 8), and/or resistors 90" (FIG. 9). By way of example, the transistor 80" is illustratively shown as an N-channel MOSFET, and it may preferably include a relatively thick field gate oxide to provide a fast turn-on and less susceptibility to gate oxide breakdown. Of course, other suitable transistors may also be used.

Each of the various isolation elements may be formed in the substrate 28", for example. The vertically conducting portions 35" would extend to the substrate 28" to connect to one terminal of its respective isolation device, and the other terminal would be connected to the electrically conductive layer 50". By way of example, the resistor 90" may be a diffused resistor. Other suitable isolation devices and configurations which will be apparent to those of skill in the art and may also be used.

In other embodiments, more than one such isolation device may be used, such as back-to-back Zener diodes connected between each ESD electrode 25" and the electrically conductive layer 50". In still further embodiments, both resistors and transistors (e.g., bipolar transistors) may be used to create a silicon controlled rectifier (SCR), as will be appreciated by those of skill in the art.

A method aspect in accordance with the invention is for making a fingerprint sensor 20. The method may include forming a fingerprint sensing portion 23 for sensing a fingerprint 27 of a user positioned adjacent thereto. The fingerprint sensing portion 23 may comprise a dielectric layer 24. The method may also include forming a plurality of ESD electrodes 25 arranged in an array and carried by the dielectric layer for ESD protection of the fingerprint sensing portion. Forming the ESD electrodes 25 may include forming the ESD electrodes in spaced apart relation in a regular pattern across the fingerprint sensing portion 23.

Forming the ESD electrodes 25 may comprise forming the ESD electrodes to be exposed at an upper surface of the dielectric layer. Forming the fingerprint sensing portion 23 may further comprise forming an array of electric field sensing electrodes 30 embedded in the dielectric layer 24. Additional method aspects of the invention will be apparent to those of skill in the art based upon the above description and will therefore not be discussed further herein.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that other modifications and embodiments are intended to be included within the scope of the appended claims.

That which is claimed is:

1. A fingerprint sensor comprising:
   a fingerprint sensing portion for sensing a fingerprint of a user positioned adjacent thereto, said fingerprint sensing portion comprising a dielectric layer and an array of sensing electrodes carried thereby;
   a plurality of electrostatic discharge (ESD) electrodes also carried by said dielectric layer for ESD protection of said fingerprint sensing portion, each ESD electrode interposed between adjacent sensing electrodes; and
   an electrically conductive layer adjacent said dielectric layer and connected to said plurality of ESD electrodes, said electrically conductive layer extending beneath said sensing electrodes.

2. A fingerprint sensor according to claim 1 wherein said plurality of ESD electrodes are arranged in spaced apart relation in a regular pattern across said fingerprint sensing portion.

3. A fingerprint sensor according to claim 1 wherein said ESD electrodes are exposed at an upper surface of said dielectric layer.

4. A fingerprint sensor according to claim 1 wherein said sensing electrodes are embedded in said dielectric layer.

5. A fingerprint sensor according to claim 1 wherein outermost ones of said sensing electrodes define an available sensing area; and wherein said ESD electrodes occupy less than about ten percent of the available sensing area.

6. A fingerprint sensor according to claim 1 wherein each of said array of sensing electrodes is of a same size; and wherein said array of sensing electrodes are arranged in a regular grid pattern with predetermined locations within the grid pattern being unoccupied by sensing electrodes and instead occupied by respective ESD electrodes.

7. A fingerprint sensor according to claim 6 wherein each of said ESD electrodes has a smaller size than the size of said sensing electrodes so as to define an enlarged spacing between each ESD electrode and adjacent sensing electrodes.

8. A fingerprint sensor according to claim 1 wherein each sensing electrode has a generally rectangular shape; and wherein sensing electrodes adjacent each ESD electrode have cut-off corner portions to provide spacing for each ESD electrode.

9. A fingerprint sensor according to claim 1 wherein said dielectric layer comprises a first dielectric layer, and further comprising:
   a second dielectric layer adjacent said electrically conductive layer and opposite said first dielectric layer; and
   a semiconductor substrate adjacent said second dielectric layer and having active semiconductor devices formed therein.

10. A fingerprint sensor according to claim 1 wherein each ESD electrode comprises a vertically conducting portion extending through said dielectric layer, and an enlarged top portion connected thereto.

11. A fingerprint sensor according to claim 10 wherein said enlarged top portion comprises gold.

12. A fingerprint sensor according to claim 1 wherein said fingerprint sensing portion further comprises an electrically conductive guard ring surrounding each sensing electrode.

13. A fingerprint sensor according to claim 1 further comprising a package surrounding said fingerprint sensing portion and having an opening therein to expose an upper surface of said fingerprint sensing portion.

14. A fingerprint sensor according to claim 1 further comprising at least one respective isolation element connecting each of said ESD electrodes to said electrically conductive layer.

15. A fingerprint sensor according to claim 14 wherein said isolation elements comprise at least one of a diode, a Zener diode, a resistor, and a transistor.

16. A fingerprint sensor comprising:
   a fingerprint sensing portion for sensing a fingerprint of a user positioned adjacent thereto, said fingerprint sensing portion comprising a dielectric layer and an array of sensing electrodes carried thereby, said array of sensing electrodes being of a same size and shape; and a plurality of electrostatic discharge (ESD) electrodes also carried by said dielectric layer for ESD protection of said fingerprint sensing portion, each ESD electrode interposed between adjacent sensing electrodes;

said array of sensing electrodes being arranged in a regular grid pattern with predetermined locations within the grid pattern being unoccupied by sensing electrodes and instead occupied by respective ESD electrodes.

17. A fingerprint sensor according to claim 16 wherein said ESD electrodes are exposed at an upper surface of said dielectric layer.

18. A fingerprint sensor according to claim 16 wherein said sensing electrodes are embedded in said dielectric layer.

19. A fingerprint sensor according to claim 16 wherein outermost ones of said sensing electrodes define an available sensing area; and wherein said ESD electrodes occupy less than about ten percent of the available sensing area.

20. A fingerprint sensor according to claim 16 wherein each of said ESD electrodes has a smaller size than the size of said sensing electrodes so as to define an enlarged spacing between each ESD electrode and adjacent sensing electrodes.

21. A fingerprint sensor according to claim 16 wherein said fingerprint sensing portion further comprises a semiconductor substrate adjacent said dielectric layer and having active semiconductor devices formed therein.

22. A fingerprint sensor according to claim 16 wherein each ESD electrode comprises a vertically conducting portion extending through said dielectric layer, and an enlarged top portion connected thereto.

23. A fingerprint sensor according to claim 16 further comprising an electrically conductive layer adjacent said dielectric layer and connected to said plurality of ESD electrodes, said electrically conductive layer extending beneath said sensing electrodes.

24. A fingerprint sensor according to claim 23 further comprising at least one respective isolation element connecting each of said ESD electrodes to said electrically conductive layer.

25. A fingerprint sensor according to claim 24 wherein said isolation elements comprise at least one of a diode, a Zener diode, a resistor, and a transistor.

26. A fingerprint sensor according to claim 16 wherein said ESD electrodes have a substantially similar shape as said sensing electrodes.

27. A fingerprint sensor comprising:

a fingerprint sensing portion for sensing a fingerprint of a user positioned adjacent thereto, said fingerprint sensing portion comprising a dielectric layer and an array of sensing electrodes carried thereby;

a plurality of electrostatic discharge (ESD) electrodes also carried by said dielectric layer for ESD protection of said fingerprint sensing portion, each ESD electrode interposed between adjacent sensing electrodes, and said plurality of ESD electrodes being arranged in spaced apart relation in a regular pattern across said fingerprint sensing portion; and at least one respective isolation device connecting each of said ESD electrodes to a voltage reference.

28. A fingerprint sensor according to claim 27 wherein said ESD electrodes are exposed at an upper surface of said dielectric layer.

29. A fingerprint sensor according to claim 27 wherein said sensing electrodes are embedded in said dielectric layer.

30. A fingerprint sensor according to claim 27 wherein outermost ones of said sensing electrodes define an available sensing area; and wherein said ESD electrodes occupy less than about ten percent of the available sensing area.

31. A fingerprint sensor according to claim 27 wherein each of said array of sensing electrodes is of a same size; and wherein said array of sensing electrodes are arranged in a regular grid pattern with predetermined locations within the grid pattern being unoccupied by sensing electrodes and instead occupied by respective ESD electrodes.

32. A fingerprint sensor according to claim 31 wherein each of said ESD electrodes has a smaller size than the size of said sensing electrodes so as to define an enlarged spacing between each ESD electrode and adjacent sensing electrodes.

33. A fingerprint sensor according to claim 27 wherein each sensing electrode has a generally rectangular shape; and wherein sensing electrodes adjacent each ESD electrode have cut-off corner portions to provide spacing for each ESD electrode.

34. A fingerprint sensor according to claim 27 wherein said fingerprint sensing portion further comprises a semiconductor substrate adjacent said dielectric layer and having active semiconductor devices formed therein.

35. A fingerprint sensor according to claim 27 wherein each ESD electrode comprises a vertically conducting portion extending through said dielectric layer, and an enlarged top portion connected thereto.

36. A fingerprint sensor according to claim 27 further comprising an electrically conductive layer adjacent said dielectric layer and connecting each of said isolation elements to the voltage reference, said electrically conductive layer extending beneath said sensing electrodes.

37. A fingerprint sensor according to claim 27 wherein said isolation elements comprise at least one of a diode, a Zener diode, a resistor, and a transistor.

38. A fingerprint sensor according to claim 27 wherein the voltage reference comprises ground.

39. A method for making a fingerprint sensor comprising:

forming an electrically conductive layer;

forming a fingerprint sensing portion adjacent the electrically conductive layer for sensing a fingerprint of a user positioned adjacent thereto, the fingerprint sensing portion comprising a dielectric layer and an array of sensing electrodes carried thereby, the electrically conductive layer extending beneath the field sensing electrodes; and forming a plurality of electrostatic discharge (ESD) electrodes interposed between adjacent sensing electrodes and carried by the dielectric layer for ESD protection of the fingerprint sensing portion, each ESD electrode being connected to the electrically conductive layer.

40. A method according to claim 39 wherein forming the plurality of ESD electrodes comprises arranging the plurality of ESD electrodes in spaced apart relation in a regular pattern across the fingerprint sensing portion.

41. A method according to claim 39 wherein forming the plurality of ESD electrodes comprises exposing the ESD electrodes at an upper surface of the dielectric layer.

42. A method according to claim 39 wherein forming the fingerprint sensing portion comprises embedding the sensing electrodes in the dielectric layer.

43. A method according to claim 39 wherein outermost ones of the sensing electrodes define an available sensing area; and wherein the ESD electrodes occupy less than about ten percent of an available sensing area of the array of the sensing electrodes.

44. A method according to claim 39 wherein each of the array of sensing electrodes is of a same size; wherein forming the fingerprint sensing portion comprises arranging the array of sensing electrodes in a regular grid pattern with predetermined locations within the grid pattern being unoccupied by sensing electrodes; and wherein forming the ESD electrodes comprises positioning the ESD electrodes in the predetermined locations.

45. A method according to claim 39 wherein each sensing electrode has a generally rectangular shape; and wherein sensing electrodes adjacent each ESD electrode have cut-off corner portions to provide spacing for each ESD electrode.

46. A method according to claim 39 wherein each ESD electrode comprises a vertically conducting portion extending through the dielectric layer, and an enlarged top portion connected thereto.

47. A method according to claim 39 further comprising forming at least one respective isolation element connecting each of the ESD electrodes to the electrically conductive layer.

48. A method according to claim 47 wherein the isolation elements comprise at least one of a diode, a Zener diode, a resistor, and a transistor.

* * * * *

UNITED STATES PATENT AND TRADEMARK OFFICE
CERTIFICATE OF CORRECTION

PATENT NO.        : 7,076,089 B2  
APPLICATION NO. : 10/150518  
DATED             : July 11, 2006  
INVENTOR(S)       : Brandt et al.

Page 1 of 1

It is certified that error appears in the above-identified patent and that said Letters Patent is hereby corrected as shown below:

TITLE page (56)   OTHER PUBLICATIONS   Insert:

Patent Application Publication No. US 2001/0012384 published August 9, 2001 for Electronic Discharge Protection of a Capacitive Type Fingerprint Sensing Array. Inventor: Kainitsky et al.; Application Serial No. 08/927,450.

Signed and Sealed this

Twelfth Day of December, 2006

JON W. DUDAS  
*Director of the United States Patent and Trademark Office*